United States Patent
Chou

(10) Patent No.: US 7,497,592 B2
(45) Date of Patent: Mar. 3, 2009

(54) LIGHT SOURCE ASSEMBLY

(75) Inventor: Shen-Hong Chou, Kaohsiung (TW)

(73) Assignee: Au Optronics Corp., Hsinchu (TW)

( * ) Notice: Subject to any disclaimer, the term of this patent is extended or adjusted under 35 U.S.C. 154(b) by 297 days.

(21) Appl. No.: 11/363,648

(22) Filed: Feb. 28, 2006

(65) Prior Publication Data

US 2007/0153511 A1    Jul. 5, 2007

(30) Foreign Application Priority Data

Dec. 29, 2005  (TW) .................................. 94147233

(51) Int. Cl.
*F21V 7/00* (2006.01)
(52) U.S. Cl. ..................... 362/247; 362/241; 362/243
(58) Field of Classification Search ................ 362/800, 362/555, 545, 600–634, 227–252
See application file for complete search history.

(56) References Cited

U.S. PATENT DOCUMENTS 7,311,431 B2 *  12/2007  Chew et al. .................. 362/613
7,374,306 B2 *  5/2008  Liu .............................. 362/27
2006/0268548 A1 *  11/2006  Chang ......................... 362/245
2006/0274528 A1 *  12/2006  Chou et al. .................. 362/294

FOREIGN PATENT DOCUMENTS

JP           200272901           3/2002

OTHER PUBLICATIONS

China Office Action mailed Jun. 8, 2007.

* cited by examiner

*Primary Examiner*—Bao Q Truong
(74) *Attorney, Agent, or Firm*—Thomas, Kayden, Horstemeyer & Risley

(57) ABSTRACT

A light source assembly is provided. The light source assembly comprises a circuit board, a plurality of spot light sources disposed on the circuit board, and a reflector sheet disposed on the circuit board having a plurality of first holes and at least one slit extending from the periphery of each first hole. Each first hole corresponds to one of the plurality of spot light sources.

16 Claims, 9 Drawing Sheets

LIGHT SOURCE ASSEMBLY

BACKGROUND OF THE INVENTION

1. Field of the Invention

The invention relates to a light source assembly, and in particular relates to a light source assembly using light emitting diodes (LEDs) as the light source.

2. Description of the Related Art

Liquid crystal displays (LCDs) are currently in wide use in a wide variety of information indicator displays. The main structure of an LCD includes a panel module and a backlight module. The panel module mainly include at lease a glass substrate, a liquid crystal layer, an alignment layer, a color filter, a polarizer, a driving IC, and others. The backlight module mainly include at least a light source, a light guide plate, a prism, a diffuser, a reflector sheet, and others. The backlight module provides light to the panel module for displaying information. The performance of an LCD is affected by all of the internal devices of which it is composed and the backlight module is primarily responsible for screen brightness, uniformity, contrast, and viewing angle.

Generally, the backlight module is classified as a side light type or a direct type according to the position of the light source. The side light type having the light source on the side edge of the panel module has a thinner backlight module and is suitable for portable LCD. The direct type having the light source under the panel module has good uniformity in brightness and has more space for light sources and is suitable for those displays requiring high brightness and wide viewing angle.

Due to the rapid advances in lighting efficiency, the LEDs are becoming more useful for LCDs. Technically speaking, it is hoped that, in the near future, the lighting efficiency of the LED can reach or exceed that of the cold cathode tube. Due to its swift response and feature of emitting visible light, such as red, blue and green, the LED has a great opportunity to play a leading role as the light source for use by the LCD industry.

The brightness of the LED provided to LCD depends not only on the LED itself but also on the design and assembly of the reflector sheet adjacent to the LED.

The covering area of the reflector sheet adjacent to the LED is closely related to the brightness of the LED.

Referring to FIG. 1A and FIG. 1B, in the related art, while using a plurality of LEDs 200 as light sources and considering the assembly tolerance of the reflector sheet 300 for some unexpected accounts that may cause the position of each LEDs 200 to change, the reflector sheet 300 needs a larger hole 350 and this will result in reducing the covering area of the reflector sheet 300. In other circumstances, the leads 250 of the LEDs 200 are electrically connected to the circuit board 100 by welding solder 400 to the circuit board 100 which causes the assembly surface to be uneven resulting in a bad interface with reflector sheet 300. The hole 350 of the reflector sheet 300 must be enlarged to avoid the welding position and this also will result in reducing the covering area of the reflector sheet 300.

Hence, a method of improving the covering area of the reflector sheet 300 so as to improve the lighting efficiency of the backlight module is desirable.

BRIEF SUMMARY OF THE INVENTION

An object of the invention is to provide a light source assembly having high lighting efficiency, especially to provide a light source assembly using light emitting diodes as the light sources having high lighting efficiency.

In a preferred embodiment of the invention, a light source assembly comprises a circuit board, a plurality of spot light sources disposed on the circuit board, and a reflector sheet disposed on the circuit board having a plurality of first holes and at least one slit extending from the periphery of each first hole. Each first hole corresponds to one of the plurality of spot light sources.

In a preferred embodiment of the invention, a light source assembly comprises at least two circuit boards, a plurality of spot light sources back welded between the at least two circuit boards, and a reflector sheet disposed on the at least two circuit boards having a plurality of first holes and at least one slit extending from the periphery of each first hole. Each first hole corresponds to one of the plurality of spot light sources.

In another preferred embodiment of the invention, a light source assembly comprises a circuit board, a plurality of spot light sources disposed on the circuit board, and a reflector sheet disposed on the circuit board having a plurality of first holes. Each first hole corresponds to one spot light source and the reflector sheet adjacent to each first hole forms an angle between about 0 degree to about 90 degree with the circuit board.

In yet another preferred embodiment of the invention, a light source assembly comprises at least two circuit boards, a plurality of spot light sources back welded between the at least two circuit boards, and a reflector sheet disposed on the circuit board having a plurality of first holes. Each first hole corresponds to one spot light source and the reflector sheet adjacent to each first hole forms an angle between about 0 degree to about 90 degree with the circuit board.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
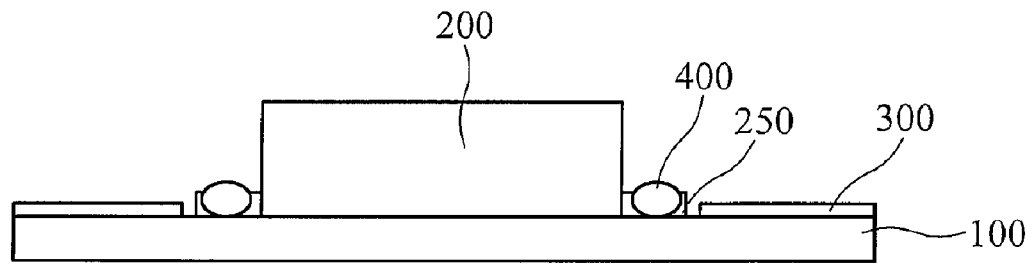
FIG. 1A is a schematic view of a conventional light source assembly (front view)
Figure 1B:
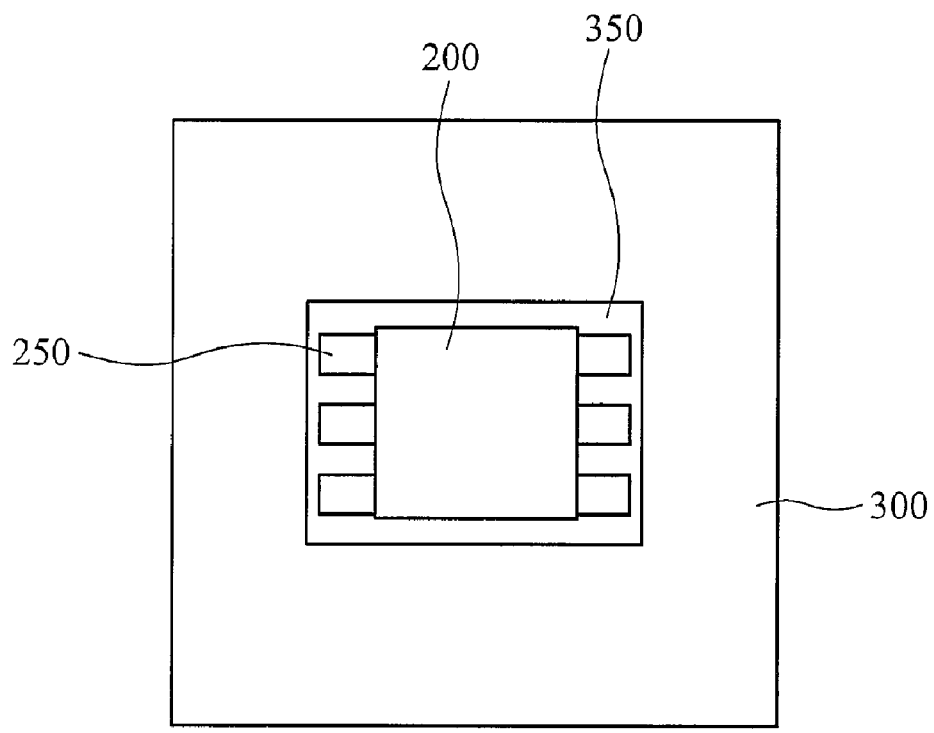
FIG. 1B is a schematic view of a conventional light source assembly (top view)
Figure 2:
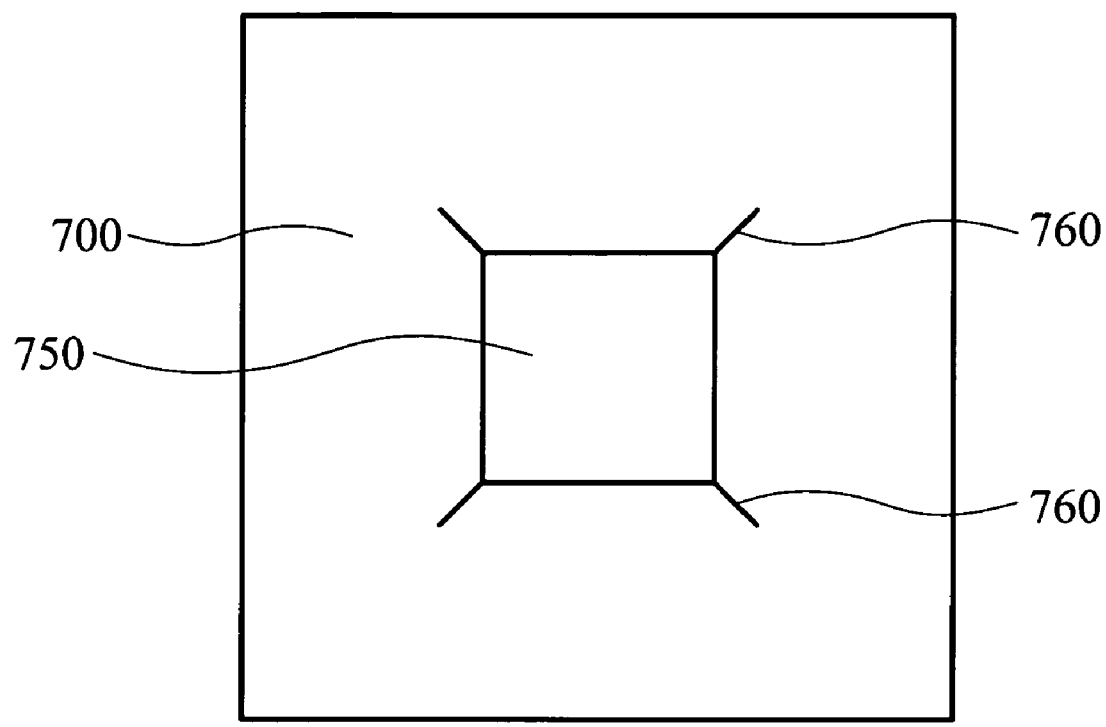
FIG. 2 is an embodiment of the reflector sheet of the invention.
Figure 3A:
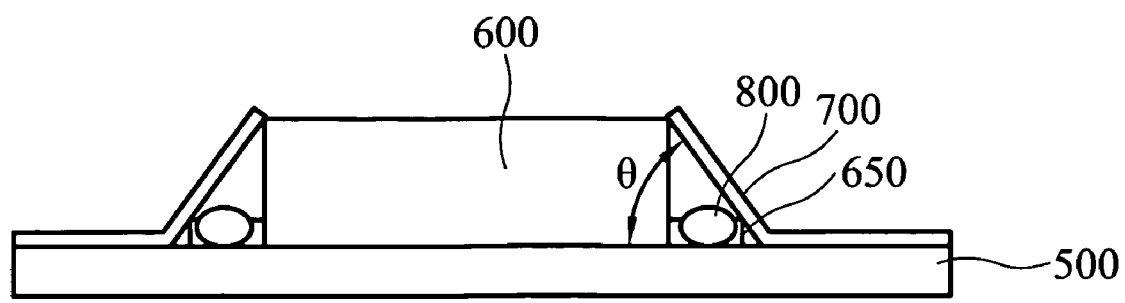
FIG. 3A is a schematic view of an embodiment of a light-source assembly of the invention (front view)
Figure 3B:
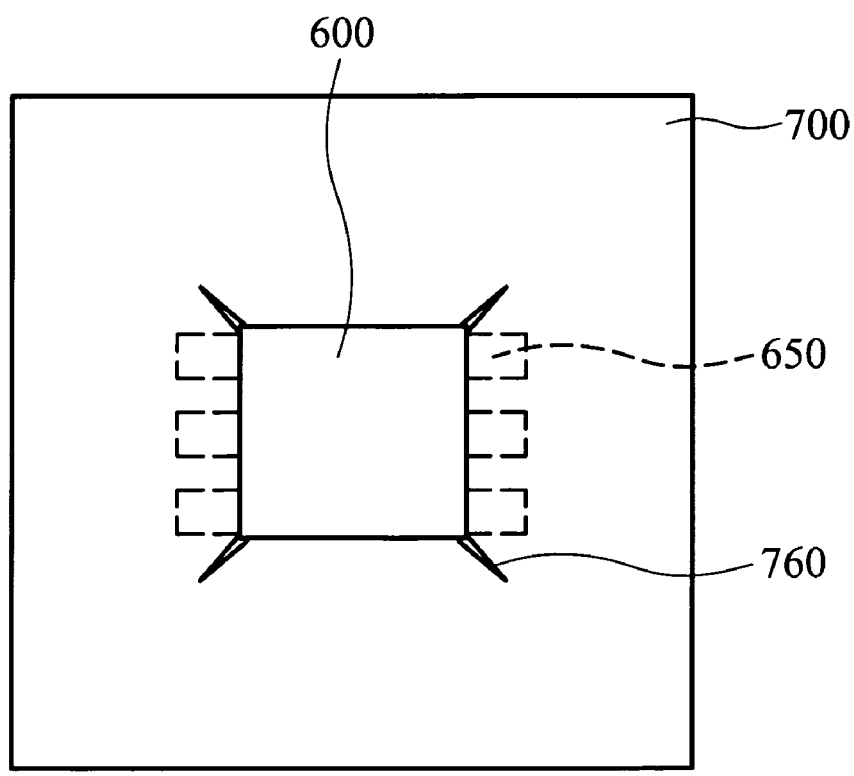
FIG. 3B is a schematic view of an embodiment of a light source assembly of the invention (top view)

Referring to FIG. 2, it shows a reflector sheet 700 suitable for the light source assembly of the invention but only has a hole 750 for simplifying the reflector sheet 700 having a plurality of holes 750. The hole 750 has at least one slit 760 extended from the periphery of the hole 750. In FIG. 2, the hole 750 has four slits 760 extended from the periphery of the hole 750 independently. The slit 760 can be a line extended from the line passing through the center of the hole 750 or only a line extended from the periphery of the hole 750 without special orientation or others as required. To simplify the design rule, a hole 750 having a rectangular shape have four slits 760 symmetrically extending from the four corners of the rectangle hole 750. To follow the example, a polygon hole 750 having N sides will have N slits 760 symmetrically extended from the N corners of the polygon hole 750. For a circle hole 750, a plurality of slits 760 symmetrically extending from the center of the circle hole 750 is suggested. In practice, the shape of the hole 750 depends on the light source used and has no special limitation. The number, the arrangement, and the length of the slits 760 can be changed as required. The method of forming the slit 760 and the hole 750 can be pressing, cutting, or punching, without limitation. To simplify the procedure, the slit 760 and the hole 750 can be formed simultaneously. FIG. 3A and FIG. 3B show the schematic view of the light source assembly of the invention. Only one circuit board 500, one spot light source (such as LED 600) welded to the circuit board 500, and one reflector sheet 700 are shown for simplification. The reflector sheet 700 has a hole 750 corresponding to the spot light source (LED 600) and the periphery of the hole 750 has at least one slit 760 extended from the hole 750, as shown in FIG. 2. The aperture of the hole 750 is slightly smaller than the size of the spot light source (LED 600). The reflector sheet 700 disposed on the circuit board 500 doesn't shield the emission surface of the spot light source (LED 600) which is better. In one embodiment, the spot light source (LED 600) has a top-emission surface and the reflector sheet 700 doesn't shield the emission surface of the spot light source (LED 600).

The reflector sheet 700 is disposed on the circuit board 500 and the reflector sheet 700 adjacent to the hole 750 forms an angle θ between about 0 degree to about 90 degree with the circuit board 500. The angle θ will change with the height of the spot light source (LED 600), the length of lead 650 of the spot light source (LED 600), and the amount of the solder 800. As shown in the figure, only the emission surface of the spot light source (LED 600) is exposed. In practice, the reflector sheet 700 should only shield the lead 650 and the solder 800 but is not limited to this.

Figure 4:
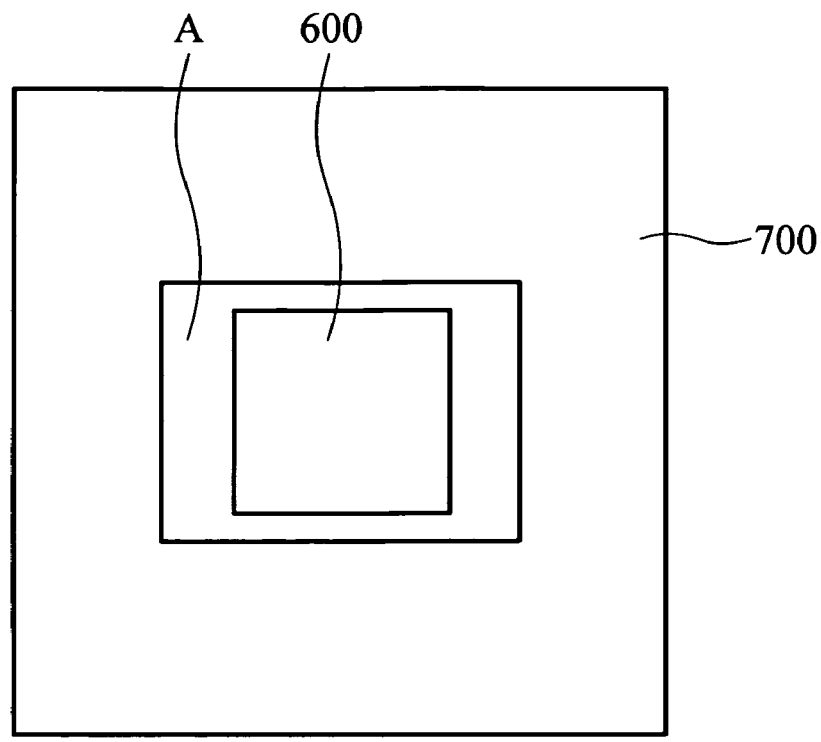
FIG. 4 is an embodiment demonstrating the increased area of the reflector sheet of the invention.

Referring to FIG. 4, the area A surrounding the spot light source (LED 600) shows the increased reflecting area in a preferred embodiment of the invention. It demonstrates the emission efficiency of a spot light source can be improved by increasing the reflecting area from a proper design of the reflector sheet 700 of the invention.

In the embodiment as described above, the spot light source (LED 600) is disposed on the circuit board 500 by welding the circuit board 500. In another embodiment, referring to FIG. 5, the spot light source (LED 600) is disposed on the circuit board 500 by back welding the lead 650' of the spot light source (LED 600') to the lower surface of the circuit board 500'.

Figure 6:
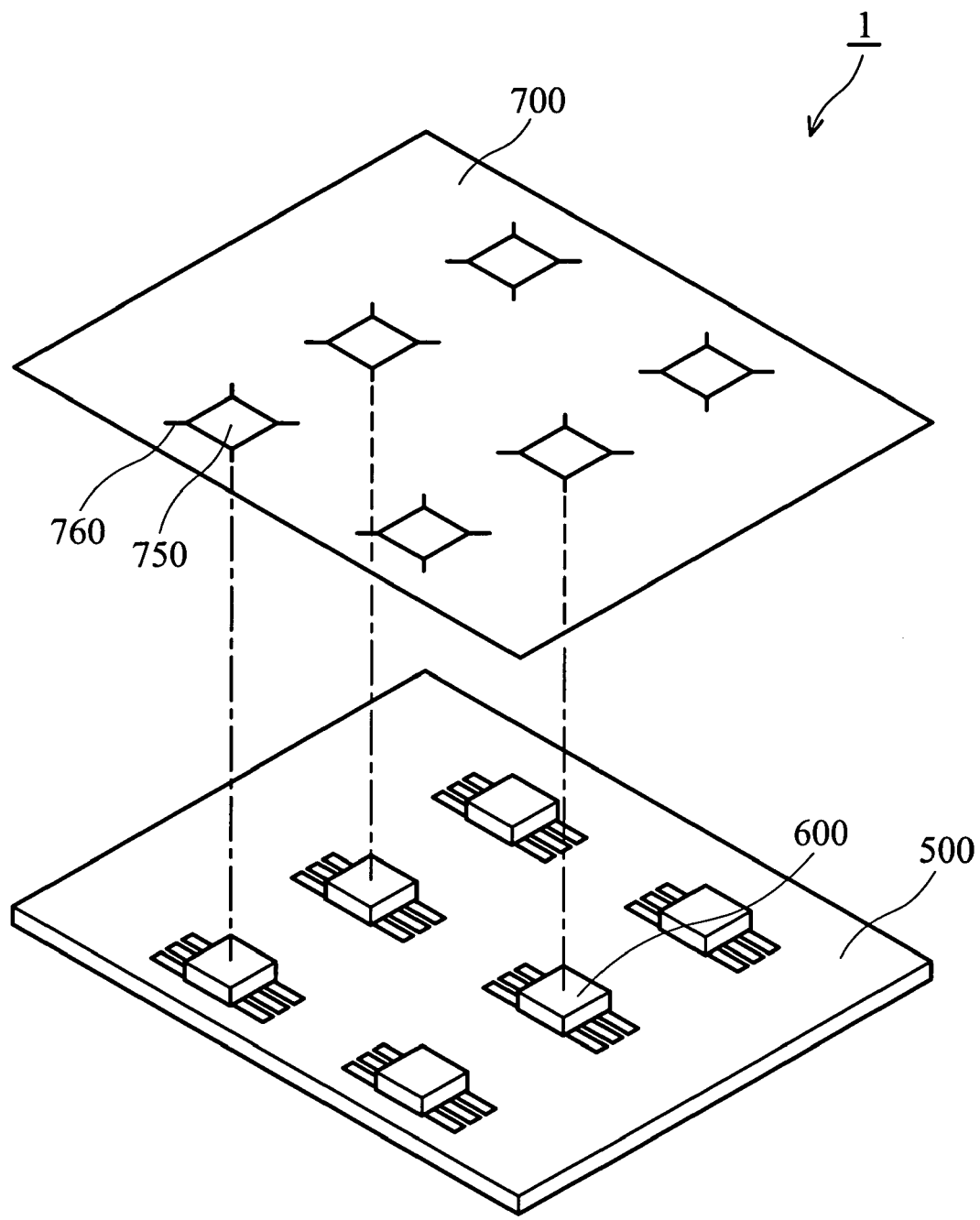
FIG. 6 is a schematic view of the first embodiment of light source assembly having a plurality of spot light sources.

Referring to FIG. 3A and FIG. 6 which is a schematic view of the first embodiment of light source assembly having a plurality of spot light sources, the light source assembly 1 comprises a circuit board 500, a plurality of spot light sources 600 disposed on the circuit board 500, and a reflector sheet 700 having a plurality of first holes 750. The reflector sheet 700 disposed on the circuit board 500 has a plurality of first holes 750 corresponding to one spot light source 600 and has at least one slit 760 extending from the periphery of the first hole 750.

Figure 5:
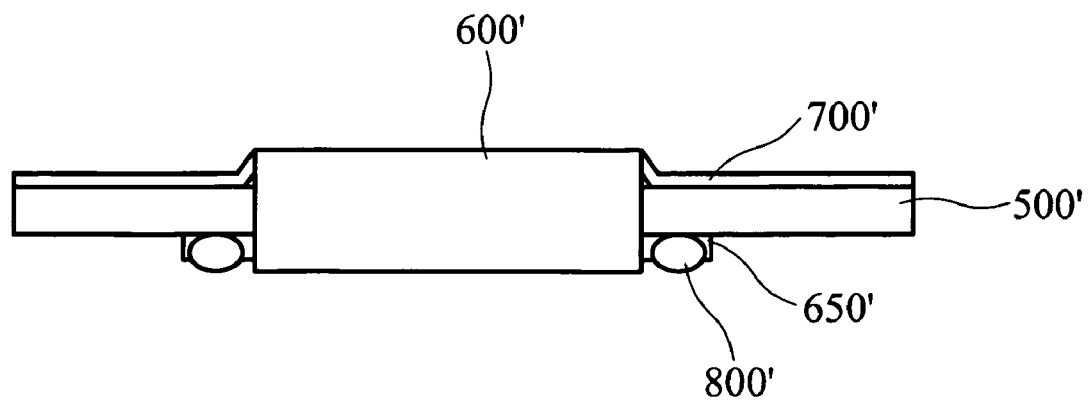
FIG. 5 is a schematic view of an embodiment of spot light source back welded to the circuit board.
Figure 7:
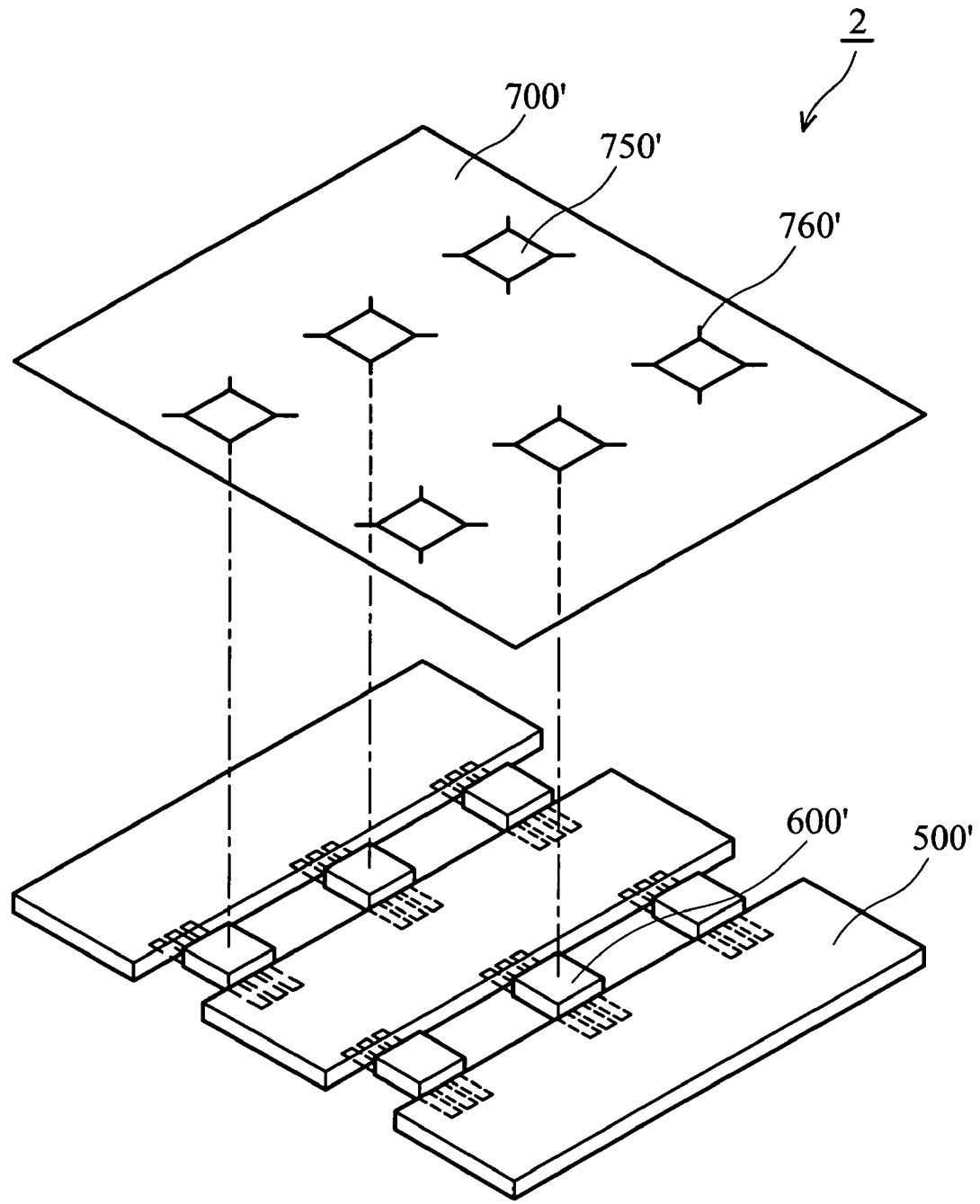
FIG. 7 is a schematic view of the second embodiment of light source assembly having a plurality of spot light sources.

Referring to FIG. 5 and FIG. 7 which is a schematic view of the second embodiment of light source assembly having a plurality of spot light sources. The light source assembly 2 comprises at least two circuit boards 500', a plurality of spot light sources 600' back welded between the at least two circuit boards 500', and a reflector sheet 700' disposed on the at least two circuit boards 500' having a plurality of holes 750'. Each hole 750' corresponds to one spot light source 600' and has at least one slit 760' extending from the periphery of the hole 750'.

Figure 8:
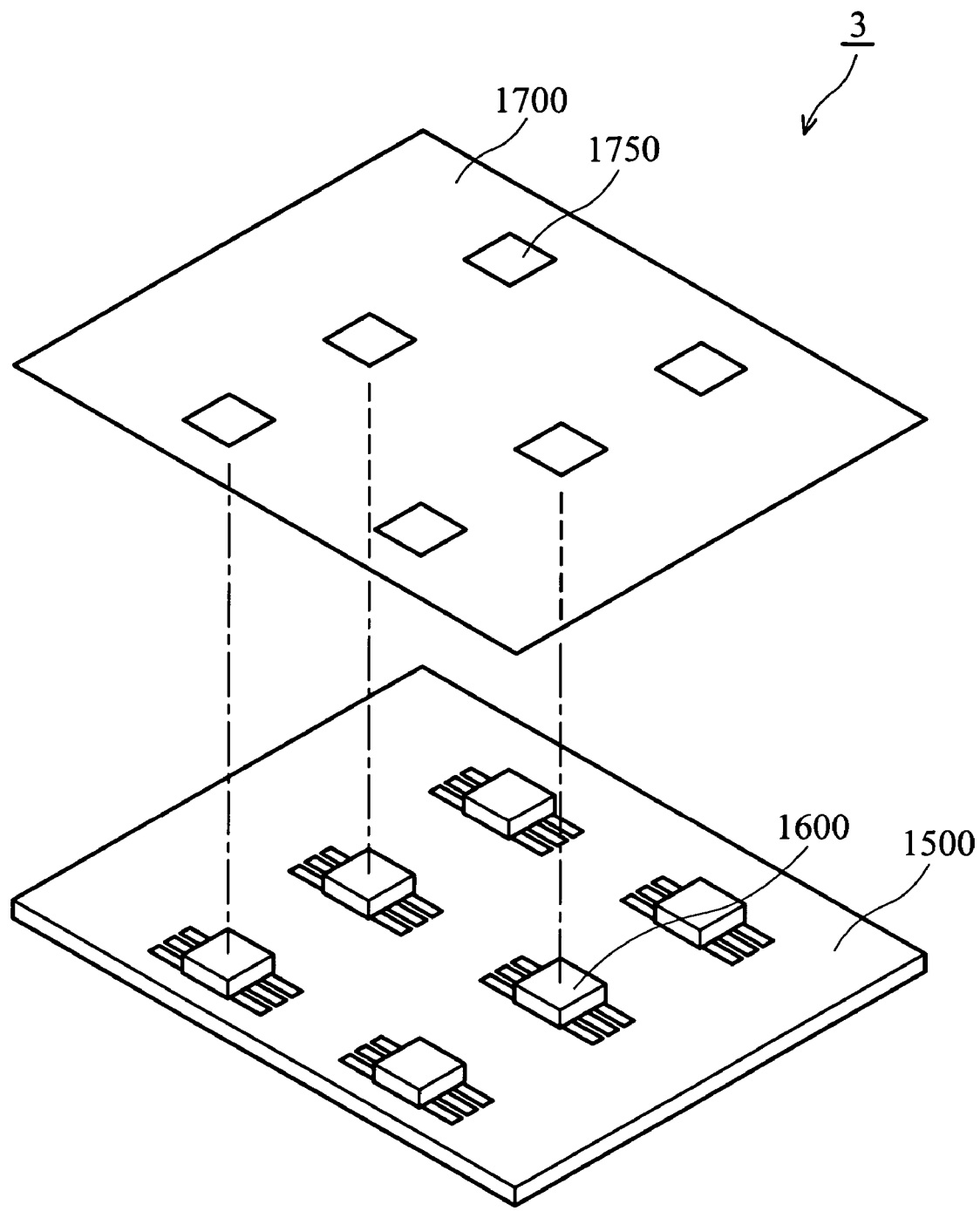
FIG. 8 is a schematic view of the third embodiment of light source assembly having a plurality of spot light sources.

Referring to FIG. 3A and FIG. 8 which is a schematic view of the third embodiment of light source assembly having a plurality of spot light sources, the light source assembly 3 comprises a circuit board 1500, a plurality of spot light sources 1600 disposed on the circuit board 1500, and a reflector sheet 1700 having a plurality of holes 1750. The reflector sheet 700 disposed on the circuit board 1500 has a plurality of holes 1750 corresponding to one spot light source 1600. The reflector sheet 1700 adjacent to each hole 1750 forms an angle between about 0 degree to about 90 degree with the circuit board 1500.

In this embodiment, the reflector sheet 1700 can be a deformable material, such as a resin film having reflecting function, and the slits can be omitted. The reflector sheet 1700 is disposed on the circuit board 1500 and the reflector sheet 1700 adjacent to the hole 1750 is deformed to form an angle θ between about 0 degree to about 90 degree with the circuit board 1500.

Figure 9:
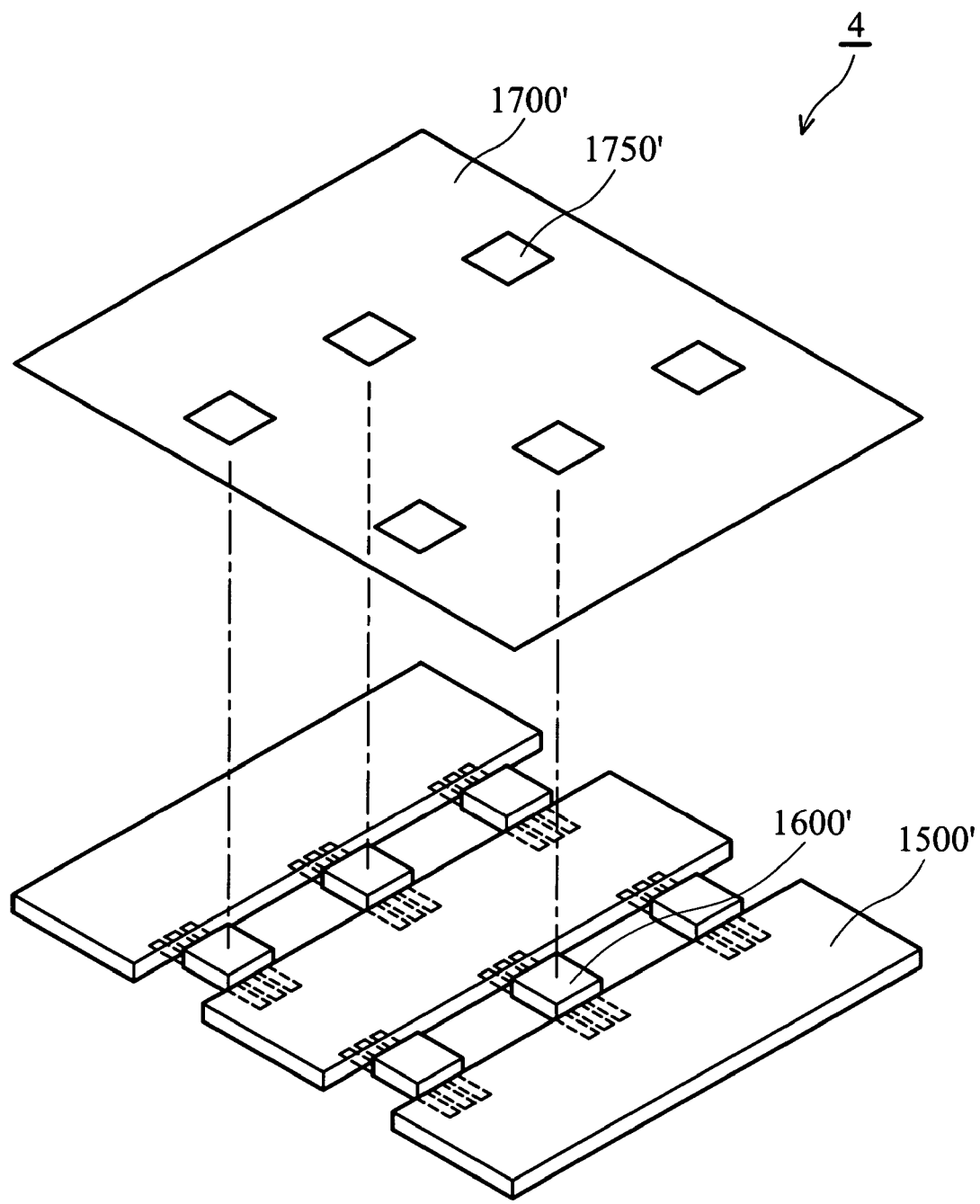
FIG. 9 is a schematic view of the fourth embodiment of light source assembly having a plurality of spot light sources.

Referring to FIG. 5 and FIG. 9 which is a schematic view of the fourth embodiment of light source assembly having a plurality of spot light sources, the light source assembly 4 comprises at least two circuit boards 1500', a plurality of spot light sources 1600' back welded between the at least two circuit boards 1500', and a reflector sheet 1700' disposed on the at least two circuit boards 1500' having a plurality of holes 1750'. Each hole 1750' corresponds to one spot light source 1600'. The reflector sheet. 1700' adjacent to each hole 1750' forms an angle θ between about 0 degree to about 90 degree with the circuit board 1500'.

In this embodiment, the reflector 1700' could be a deformable material, such as a resin film having a reflecting function, and the slits are not necessary. The reflector sheet 1700' disposed on the circuit board 1500' and the reflector sheet 1700' adjacent to the hole 1750' is deformed to form an angle θ between about 0 degree to about 90 degree with the circuit board 1500'.

Figure 10:
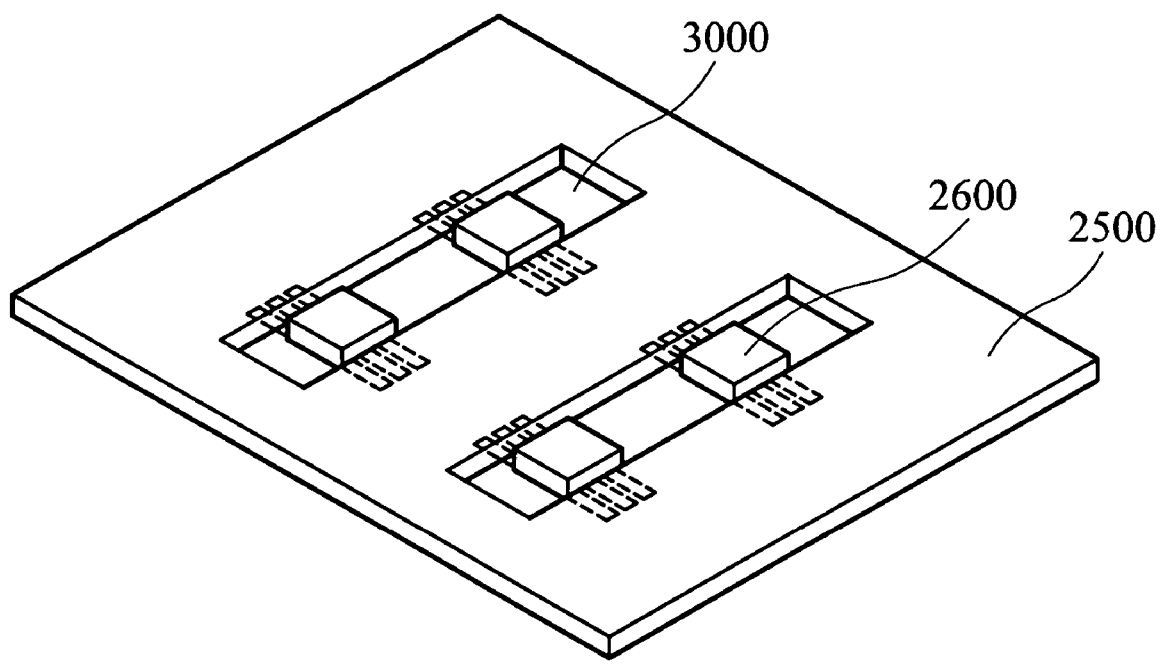
FIG. 10 is a schematic view of another embodiment of spot light sources back welded to the circuit board.

FIG. 10 is a schematic view of another embodiment of spot light sources 2600 back welded to the circuit board 2500. The circuit board 2500 has a plurality of second holes 3000 corresponding to at least one spot light source 2600. For simplicity, FIG. 10 shows only two second holes 3000 and each second hole 3000 has two spot light sources 2600 correspondingly. The spot light sources 2600 are back welded with the circuit board 2500. In FIG. 10, it demonstrates one second hole 3000 has two spot light sources 2600 correspondingly. In practice, one second hole 3000 could correspond to one, two, or more than two spot light sources 2600.

The embodiments, as shown above, demonstrate only the LEDs as the spot light sources but are not limited to this. The spot light source is preferred to have a top-emission surface to prevent a decrease in lighting efficiency.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light source assembly, comprising:
   a circuit board;
   a plurality of spot light sources disposed on the circuit board; and
   a reflector sheet, disposed on the circuit board, having a plurality of first holes and at least one slit extending away from the periphery of each first hole, wherein each first hole corresponds to one of the plurality of spot light sources.

2. The light source assembly as claimed in claim 1, wherein the plurality of spot light sources are welded to the circuit board.

3. The light source assembly as claimed in claim 1, wherein the circuit board has a plurality of second holes corresponding to at least one spot light source back welded to the circuit board.

4. The light source assembly as claimed in claim 1, wherein each spot light source has a top-emission surface.

5. The light source assembly as claimed in claim 1, wherein the plurality of spot light sources comprise light emitting diodes.

6. A light source assembly, comprising:
   at least two circuit boards;
   a plurality of spot light sources disposed between and back welded onto the at least two circuit boards; and
   a reflector sheet, disposed on the at least two circuit boards, having a plurality of first holes and at least one slit extending from the periphery of each first hole, wherein each first hole corresponds to one of the plurality of spot light sources.

7. The light source assembly as claimed in claim 6, wherein each spot light source has a top-emission surface.

8. The light source assembly as claimed in claim 6, wherein the plurality of spot light sources comprise light emitting diodes.

9. A light source assembly, comprising:
   a circuit board;
   a plurality of spot light sources disposed on the circuit board; and
   a reflector sheet, made of deformable material, disposed on the circuit board, having a plurality of first holes, wherein each first hole has one spot light source squeezed therein so that the reflector sheet adjacent to each first hole is deformed to form an angle between about 0 degree to about 90 degree with the circuit board.

10. The light source assembly as claimed in claim 9, wherein the plurality of spot light sources are welded to the circuit board.

11. The light source assembly as claimed in claim 9, wherein the circuit board has a plurality of second holes corresponding to at least one spot light source back welded with the circuit board.

12. The light source assembly as claimed in claim 9, wherein each spot light source has a top-emission surface.

13. The light source assembly as claimed in claim 9, wherein the plurality of spot light sources comprise light emitting diodes.

14. A light source assembly, comprising:
    at least two circuit boards;
    a plurality of spotlight sources disposed between and back welded onto the at least two circuit boards; and
    a reflector sheet, disposed on the at least two circuit boards, having a plurality of first holes, wherein each first hole corresponds to one spot light source and the reflector sheet adjacent to each first hole forms an angle between about 0 degree to about 90 degree with the at least two circuit boards.

15. The light source assembly as claimed in claim 14, wherein each spot light source has a top-emission surface.

16. The light source assembly as claimed in claim 14, wherein the plurality of spot light sources comprise light emitting diodes.

* * * * *